United States Patent
Nakamura et al.

(10) Patent No.: US 8,791,749 B2
(45) Date of Patent: Jul. 29, 2014

(54) SEMICONDCUTOR INTEGRATED CIRCUIT INCLUDING POWER GENERATION BLOCK AND POWER SUPPLY CONTROL BLOCK

(71) Applicant: Panasonic Corporation, Osaka (JP)

(72) Inventors: Toshihiro Nakamura, Kyoto (JP); Yuji Yamasaki, Osaka (JP); Masanobu Hirose, Osaka (JP); Masahisa Iida, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/784,675

(22) Filed: Mar. 4, 2013

(65) Prior Publication Data

US 2013/0181767 A1    Jul. 18, 2013

Related U.S. Application Data

(63) Continuation of application No. PCT/JP2011/004153, filed on Jul. 22, 2011.

(30) Foreign Application Priority Data

Nov. 4, 2010    (JP) ................................. 2010-247516

(51) Int. Cl.
*G05F 1/10* (2006.01)

(52) U.S. Cl.
USPC .......................................... 327/536; 327/540

(58) Field of Classification Search
USPC ......... 327/536, 538, 540, 541, 543, 534, 544; 323/234, 265, 266, 282, 286, 287, 351
See application file for complete search history.

(56) References Cited

U.S. PATENT DOCUMENTS

| | | | |
|---|---|---|---|
| 6,169,444 B1 * | 1/2001 | Thurber, Jr. .................... | 327/536 |
| 6,359,502 B1 | 3/2002 | Endou | |
| 7,633,778 B2 * | 12/2009 | Mok et al. ........................ | 363/60 |
| 7,667,529 B2 * | 2/2010 | Consuelo et al. .............. | 327/536 |
| 8,242,833 B2 * | 8/2012 | Lin et al. ........................ | 327/536 |
| 2002/0033720 A1 | 3/2002 | Ikehashi et al. | |
| 2003/0107924 A1 | 6/2003 | Mizuno et al. | |
| 2004/0004400 A1 | 1/2004 | Nomura | |
| 2006/0103434 A1 | 5/2006 | Okamoto et al. | |
| 2008/0136472 A1 * | 6/2008 | Shor .............................. | 327/156 |

FOREIGN PATENT DOCUMENTS

| | | |
|---|---|---|
| JP | 64-082556 A | 3/1989 |
| JP | 10-107210 A | 4/1998 |
| JP | 2000-151376 A | 5/2000 |
| JP | 2000-164813 A | 6/2000 |
| JP | 2002-208275 A | 7/2002 |
| JP | 2006-172687 A | 6/2006 |

OTHER PUBLICATIONS

International Search Report for International Application No. PCT/JP2011/004153 with Date of Mailing Sep. 6, 2011.

* cited by examiner

*Primary Examiner* — Lincoln Donovan
*Assistant Examiner* — Jung H Kim
(74) *Attorney, Agent, or Firm* — McDermott Will & Emery LLP

(57) ABSTRACT

A power generation block configured to generate internal power by a charge pump circuit and a power supply control block configured to control the power generation block are provided. First and second power supply interconnects individually separated from an external power supply interconnect are connected to the power generation block and the power supply control block, respectively. At least any one of the power supply interconnects is provided with a filter section configured to remove noise propagating through the power supply interconnect.

19 Claims, 9 Drawing Sheets

US 8,791,749 B2

SEMICONDCUTOR INTEGRATED CIRCUIT INCLUDING POWER GENERATION BLOCK AND POWER SUPPLY CONTROL BLOCK

CROSS-REFERENCE TO RELATED APPLICATIONS

This is a continuation of International Application No. PCT/JP2011/004153 filed on Jul. 22, 2011, which claims priority to Japanese Patent Application No. 2010-247516 filed on Nov. 4, 2010. The entire disclosures of these applications are incorporated by reference herein.

BACKGROUND

The present disclosure relates to semiconductor integrated circuits, and specifically to a semiconductor integrated circuit including an internal power supply circuit configured to generate internal power based on external power to have a power supply voltage different from that of the external power.

In recent years, as semiconductor fabrication technologies have been advanced to provide devices using finer and finer design rules, the integration densities of memories, such as a dynamic random access memory (DRAM) and a static random access memory (SRAM), have been increased. Moreover, as the semiconductor fabrication technologies continue to progress in densification and miniaturization, the voltage of external power supplied to one semiconductor chip, for example, a system-on-chip (hereinafter referred to as SoC) continues to be reduced. Thus, a SoC which operates based on a relatively low power supply voltage has been required.

In a widely known configuration as a SoC on which memories are mounted, an internal power supply circuit mounted in a memory region, specifically an internal boosted power supply block or an internal negative voltage power supply block generates internal power having a relatively high or low power supply voltage based on external power, and the generated internal power is supplied to a memory core. This configuration addresses the problem where direct external supply of a high voltage required in the memory core becomes difficult with decreasing voltage of the external power. Moreover, this configuration aims to increase resistance against variations in power supply voltage inside and outside the SoC. Alternatively, internal power whose power supply voltage is different from that of external power may be supplied to circuit blocks, for example, to processors, and the like other than the memories.

When an internal power supply circuit, for example, an internal boosted power supply block is mounted in a memory region, an external power supply voltage widely varies along with boosting operation, specifically pumping operation, or the like to generate internal power. That is, there has been a problem where so-called power supply noise is generated. The power supply noise of external power influences the operation of other function blocks, and thus is a significant factor of unstable operation of the entirety of the SoC including the memories.

To overcome this problem, it is known to use separate power supply interconnects and power supply terminals, or to insert a filter circuit in a power supply interconnect to reduce the influence of the power supply noise over other function blocks.

For example, in Japanese Patent Publication No. 2000-151376, as illustrated in FIG. 9, in order to reduce the influence of power supply noise of a DC-DC converter 802 including an oscillator circuit 805 performing switching operation at a high speed over the other function block (memory and controlling section 803) to which external power is supplied from an external power supply terminal 804 which also supplies the external power to the DC-DC converter 802, an external power supply interconnect is separated into power supply interconnects 809, 810 respectively of the DC-DC converter 802 and the other function block 803. Resistive elements 811, 812 are respectively inserted in the power supply interconnects 809, 810, thereby reducing high-frequency power supply noise propagating to the other function block 803.

Moreover, for example, Japanese Patent Publication No. 2002-208275 discloses an example in which a resistive element is inserted between an internal power supply circuit mounted in a memory and a mesh-like metal interconnect for supplying internal power generated in the internal power supply circuit onto a function block region of the memory, thereby stably supplying the internal power to a function block of the memory.

SUMMARY

Internal power supply circuits configured to generate voltages higher than external power or voltages lower than ground (GND) within chips generally include charge pump circuits, and perform pumping operation to generate internal power. Such an internal power supply circuit is provided with a power supply control block configured to control power generation. In general, the power supply control block generates a reference voltage with reference to which a power supply voltage of the internal power is stably controlled. Moreover, in many cases, the power supply control block also generates a reference clock signal with reference to which the pumping operation is performed.

The power supply control block is operated based on the external power. Thus, when power supply noise is caused in the external power by the pumping operation of the internal power supply circuit, the power supply noise influences not only other circuit blocks but also the power supply control block in the internal power supply circuit. Thus, the voltage level of the reference voltage and the frequency of the reference clock signal generated by the power supply control block are likely to vary, which may make stable generation/supply of the internal power difficult.

Nevertheless, in conventional configurations, no consideration is given to and no countermeasure is taken against the influence of the power supply noise caused in the external power by the pumping operation over the power supply control block in the internal power supply circuit, and a countermeasure is taken only against the influence over circuit blocks other than the internal power supply circuit.

The internal power supply circuit using the charge pump circuit has contradictory characteristics that a larger amount of current is desirably supplied by a fewer number of times of pumping operation, but on the other hand, the power supply noise of the external power serving as a supply source of the current becomes larger when a large amount of current is supplied by a single pumping operation. Thus, if it is possible to reduce the influence of the power supply noise caused in the external power by the pumping operation, the internal power supply circuit can more stably supply the internal power to a memory even though the pumping capacity of the internal power supply circuit remains the same.

In view of the above-discussed problems, the instant application describes, in one general aspect, a semiconductor integrated circuit including an internal power supply circuit using a charge pump circuit, wherein the influence of power supply noise caused in external power by pumping operation in generating internal power is reduced, so that the internal power can be stably supplied.

In one aspect of the present disclosure, a semiconductor integrated circuit provided on a single semiconductor chip includes: an external power supply interconnect via which external power supplied from outside the semiconductor chip is transferred; a power generation block including a charge pump circuit, and configured to generate internal power by the charge pump circuit based on the external power, the internal power having a different power supply voltage from the external power; a power supply control block configured to control the power generation block; a circuit block configured to operate by the internal power; a first power supply interconnect branching off from the external power supply interconnect, and connected to the power generation block; a second power supply interconnect branching off from the external power supply interconnect, and connected to the power supply control block; and a filter section provided on a power supply interconnect, the power supply interconnect being at least any one of the first and second power supply interconnects, and the filter section being configured to remove noise propagating through the power supply interconnect.

In this configuration, the power generation block configured to generate internal power by the charge pump circuit, and the power supply control block configured to control the power generation block are provided. The first and second power supply interconnects branching off from the external power supply interconnect are connected to the power generation block and the power supply control block, respectively. Moreover, at least any one of the first and second power supply interconnects is provided with a filter section configured to remove noise propagating through the power supply interconnect. Thus, even when power supply noise is caused in the external power by pumping operation for generating the internal power in the power generation block, the influence of the power supply noise over the power supply control block is reduced by the filter section. Thus, it becomes possible to stably supply the internal power.

According to the present disclosure, in a semiconductor integrated circuit including an internal power supply circuit using a charge pump circuit, the influence of power supply noise caused in external power by pumping operation in generating internal power is reduced, so that the internal power can be stably supplied.

DETAILED DESCRIPTION

Embodiments of the present disclosure will be described below with reference to the drawings.

First Embodiment

Figure 1:
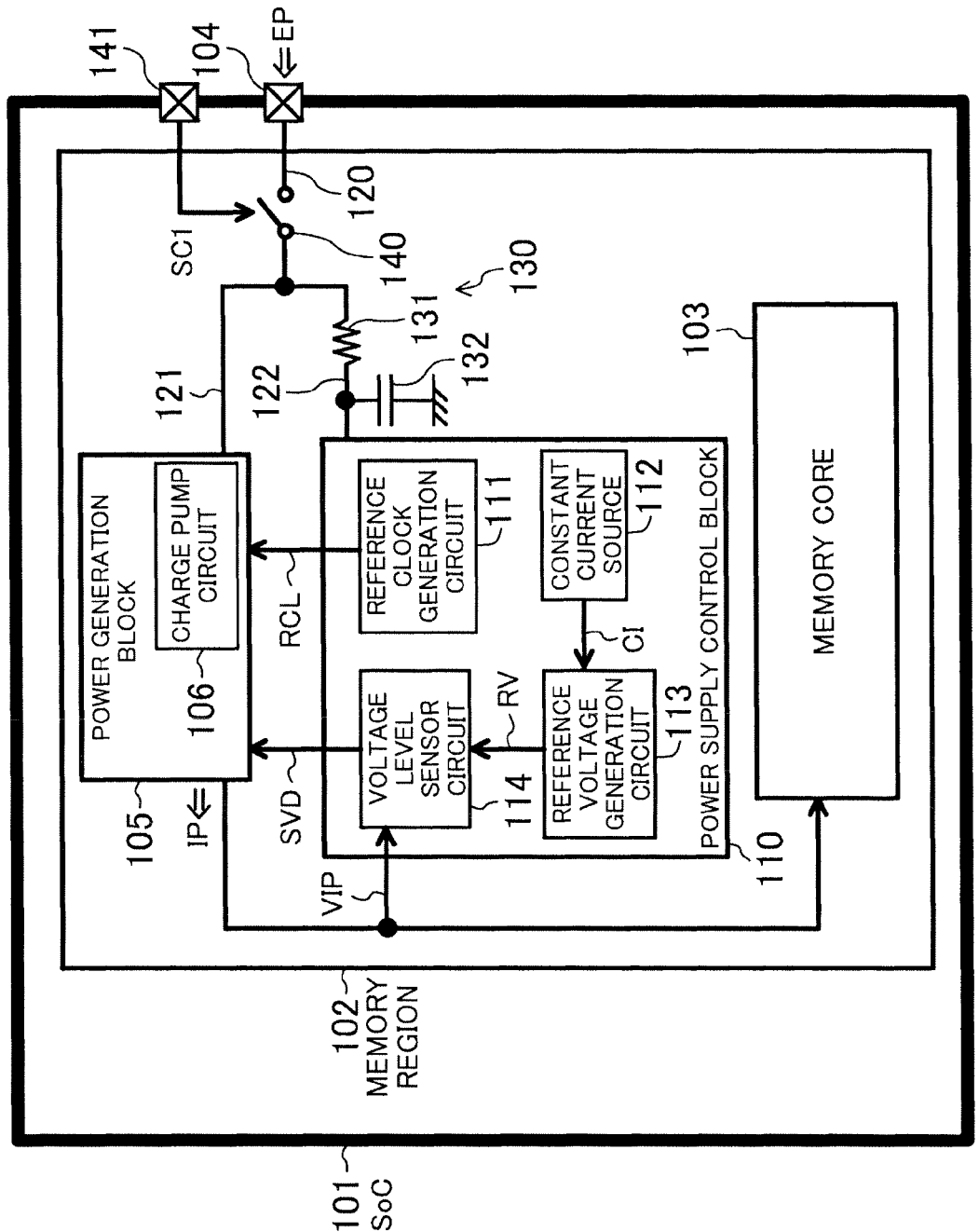
FIG. 1 is a view illustrating a configuration of a semiconductor integrated circuit according to a first embodiment.

FIG. 1 is a view schematically illustrating a configuration of a semiconductor integrated circuit according to a first embodiment. The semiconductor integrated circuit of FIG. 1 is provided on a single semiconductor chip, that is, a so-called system-on-chip (SoC) 101.

In FIG. 1, a memory core 103, a power generation block 105, and a power supply control block 110 are provided in a memory region 102. The memory core 103 serving as a circuit block includes a memory cell array, a row decoder, etc. (not shown), and operates by being supplied with internal power IP. Although not shown, other types of power having different voltages are also supplied to the memory core 103. The power generation block 105 includes a charge pump circuit 106. By using the charge pump circuit 106, the power generation block 105 generates the internal power IP based on external power EP. The power supply voltage of the internal power IP is different from that of the external power EP. The charge pump circuit 106 includes a pumping capacitive element, etc. (not shown). Here, the power generation block 105 is a boosted power supply block configured to generate internal power IP having a higher power supply voltage than external power EP.

The power supply control block 110 is configured to control the power generation block 105, and includes a reference clock generation circuit 111, a constant current source 112, a reference voltage generation circuit 113, and a voltage level sensor circuit 114. The reference clock generation circuit 111 generates a reference clock signal RCL for controlling pumping operation of the charge pump circuit 106, and applies the generated reference clock signal RCL to the power generation block 105. The constant current source 112 generates a constant current CI. Based on the constant current CI, the reference voltage generation circuit 113 generates a reference voltage RV which will be compared with a power supply voltage VIP of the internal power supply IP. The voltage level sensor circuit 114 compares the power supply voltage VIP of the internal power supply IP with the reference voltage RV. When the power supply voltage VIP is lower than the reference voltage RV, the voltage level sensor circuit 114 sends a voltage level sensing signal SVD to the power generation block 105.

Reference number 104 denotes an external power supply terminal to which the external power EP is supplied from outside the SoC 101. Reference number 120 denotes an external power supply interconnect configured to transfer the external power EP. Reference number 121 denotes a first power supply interconnect branching off from the external power supply interconnect 120 and connected to the power generation block 105. Reference number 122 denotes a second power supply interconnect branching off from the external power supply interconnect 120 and connected to the power supply control block 110. A filter section 130 including a resistive element 131 and a capacitive element 132 is provided on the second power supply interconnect 122. The resistive element 131 is made of, for example, a metal interconnect, and is inserted in the second power supply interconnect 122. The capacitive element 132 is connected between the second power supply interconnect 122 and ground. The filter section 130 is configured to remove power supply noise which is generated by pumping operation of the power generation block 105, and propagates through the first and second power supply interconnects 121, 122.

A switching element 140 whose on/off operation is controlled by a switch control signal SC1 is inserted in the external power supply interconnect 120. Reference number 141 denotes an external terminal to which the switch control signal SC1 is applied.

Operation of the semiconductor integrated circuit of FIG. 1 will be described. First, a case will be described where the power generation block 105 generates the internal power IP, and the memory core 103 operates by being supplied with the internal power IP.

The external power EP supplied to the external power supply terminal 104 is supplied to the power generation block 105 and the power supply control block 110 via the external power supply interconnect 120 as well as the first and second power supply interconnects 121, 122. Here, the switching element 140 is in an on state (conductive state) based on the switch control signal SC1 applied to the external terminal 141.

In the power supply control block 110 supplied with the external power EP, the reference clock generation circuit 111 generates the reference clock signal RCL, and applies the generated reference clock signal RCL to the power generation block 105. Moreover, the constant current source 112 generates the constant current CI, and the reference voltage generation circuit 113 receives the constant current CI to generate the reference voltage RV. The voltage level sensor circuit 114 compares the power supply voltage VIP of the internal power IP with the reference voltage RV. When the power supply voltage VIP is lower than the reference voltage RV, the voltage level sensor circuit 114 outputs the voltage level sensing signal SVD to the power generation block 105, whereas when the power supply voltage VIP is higher than the reference voltage RV, the voltage level sensor circuit 114 does not output the voltage level sensing signal SVD.

In the power generation block 105 supplied with the external power EP, the charge pump circuit 106 performs the pumping operation according to the reference clock signal RCL applied from the power supply control block 110 to generate the internal power IP. The power generation block 105 executes the pumping operation while receiving the voltage level sensing signal SVD from the power supply control block 110, whereas the power generation block 105 stops the pumping operation while not receiving the voltage level sensing signal SVD. The power generation block 105 stops the pumping operation while not receiving the voltage level sensing signal SVD because when the power supply voltage VIP of the internal power IP is higher than the reference voltage RV, the internal power IP is believed to be satisfactorily supplied to the memory core 103. When the power supply voltage VIP of the internal power IP has been reduced below the reference voltage RV due to current consumption in the memory core 103 after the stop of the pumping operation, the voltage level sensor circuit 114 outputs the voltage level sensing signal SVD again so that the power generation block 105 starts the pumping operation. With this operation, the power supply voltage VIP of the internal power IP is stably maintained.

Here, during the pumping operation of the power generation block 105, power supply noise caused by the pumping operation may be propagated to the power supply control block 110 via the first and second power supply interconnects 121, 122. When the power supply noise caused by the pumping operation is propagated to the power supply control block 110, the reference voltage RV generated in the power supply control block 110 is caused to be unstable, or the cycle of the reference clock signal RCL generated in the reference clock generation circuit 111 is caused to be irregular. This may cause difficulties in stably supplying the internal power IP.

Thus, in the present embodiment, the second power supply interconnect 122 is provided with the filter section 130 including the resistive element 131 and the capacitive element 132. The filter section 130 significantly reduces the propagated power supply noise. Thus, it is possible to significantly reduce the influence of the power supply noise caused by the pumping operation of the power generation block 105 over the power supply control block 110. Thus, the power supply control block 110 can generate and supply the reference voltage RV and the reference clock signal RCL which are stable. As a result, it becomes possible to stably supply the internal power IP.

Next, a case will be described where it is not necessary to supply the internal power IP to the memory core 103, for example, where the memory in the SoC 101 is not used.

In this case, the switching element 140 is set to an off state (non-conductive state) by the switch control signal SC1 applied to the external terminal 141. This interrupts supply of the external power EP to the power generation block 105 and the power supply control block 110. Since the supply of the external power EP is interrupted, the power generation block 105 does not perform the pumping operation, and thus the power supply control block 110 also stops circuit operation.

The supply of the external power EP is interrupted at its source by the switching element 140 provided on the external power supply interconnect 120. Thus, current consumption, including stand-by components such as leakage, in the power generation block 105 and the power supply control block 110 is reduced to zero. As a result, a current consumed by the external power EP in the memory region 102 is only a leakage component in the switching element 140. As described above, for example, in the case where the memory is not used, the switching element 140 is turned off, so that it becomes possible to reduce the current consumption by the external power EP to almost zero.

As described above, according to the present embodiment, it is possible, during the operation of the memory, to significantly reduce the influence of the power supply noise of the external power EP generated in the power generation block 105 over the power supply control block 110. Thus, it becomes possible to stably supply the internal power IP. Moreover, when the memory is not used, the switching element 140 is turned off, so that the current consumption by the external power EP in the memory region 102 can be reduced to almost zero, which allows overall power consumption of the SoC 101 to be significantly reduced.

Note that the resistance value of the resistive element 131 and the capacitance value of the capacitive element 132 may accordingly be set in consideration of, for example, operational stability of the power supply control block 110 and a frequency component of power supply noise which is to be reduced. As an example, the resistive element 131 may have a resistance value of 50Ω, and the capacitive element 132 may have a capacitance value of 100 pF. In this case, when the current consumption in the power supply control block 110 is, for example, 500 μA, the voltage drop of the external power EP supplied to the power supply control block 110 can be limited to about 25 mV while high-frequency power supply noise having a cycle of 5 ns or less is removed.

Although, in the present embodiment, the filter section 130 includes the resistive element 131 and the capacitive element 132, the present disclosure is not limited to this. Alternatively, the advantage of reducing the power supply noise can also be obtained to some extent by using only the resistive element 131. In this case, the area required for disposition of the capacitive element 132 can be omitted. For the same reason, only the capacitive element 132 may be used.

Figure 2:
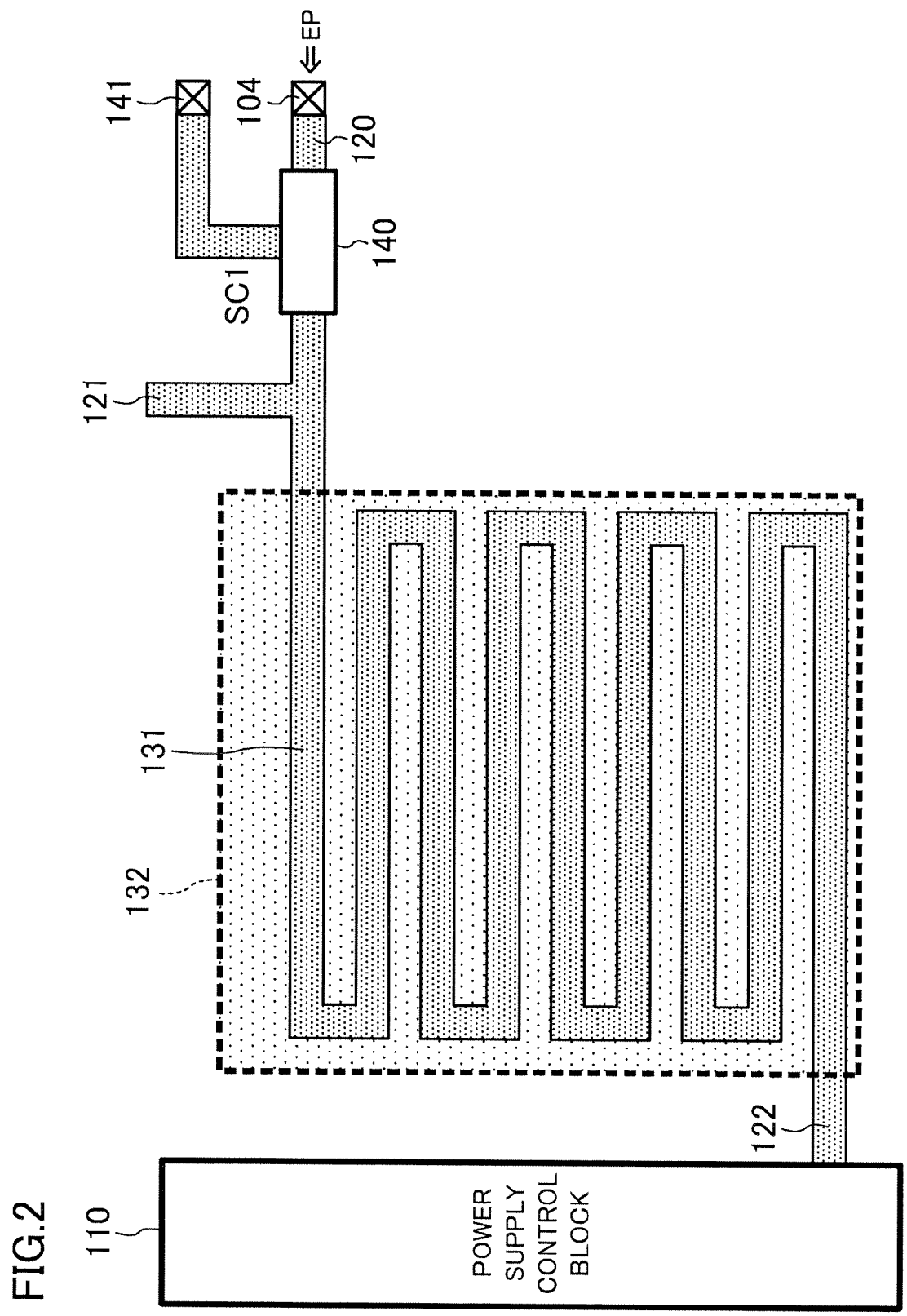
FIG. 2 is a plan view illustrating an example layout configuration of the filter section of FIG. 1.

FIG. 2 is a layout plan view illustrating an example configuration of the filter section 130 of FIG. 1. In the configuration of FIG. 2, the resistive element 131 includes a long-distance metal interconnect including a plurality of stages of folds, and the capacitive element 132 is made of a MOS capacitor element under the resistive element 131.

The resistive element 131 is stacked over the capacitive element 132 so that the resistive element 131 overlaps the capacitive element 132 when viewed from above, thereby reducing the layout area. For example, the layout area can be reduced to ½ of that of the case where the resistive element 131 is made of polysilicon. Thus, the chip size and costs of the SoC 101 can be reduced. In the case where the resistive element 131 is made of polysilicon, the advantage that the area required for the resistive element 131 can significantly be reduced is obtained.

Although in FIG. 2, an example configuration has been described where the resistive element 131 is stacked over the capacitive element 132, the present disclosure is not limited to this configuration. Alternatively, a configuration may be possible in which the resistive element 131 and the capacitive element 132 are stacked so that the resistive element 131 and the capacitive element 132 overlap the memory core 103 when viewed from above. Alternatively, the resistive element 131 and the capacitive element 132 may be formed to overlap other components in the memory region 102, for example, a transistor function block, a capacitive element, a signal interconnect, a power supply interconnect, etc. or may be formed to overlap other circuit blocks outside the memory region 102. Although an example has been described where the capacitive element 132 is made of a MOS capacitor element, the present disclosure is not limited to this. Alternatively, the capacitive element 132 may be made of a so-called metal oxide metal (MOM) capacitor having interconnect capacitance. Also in this case, when made of a metal interconnect layer different from the resistive element 131, the capacitive element 132 is stackable and is easily stacked over other components.

Second Embodiment

Figure 3:
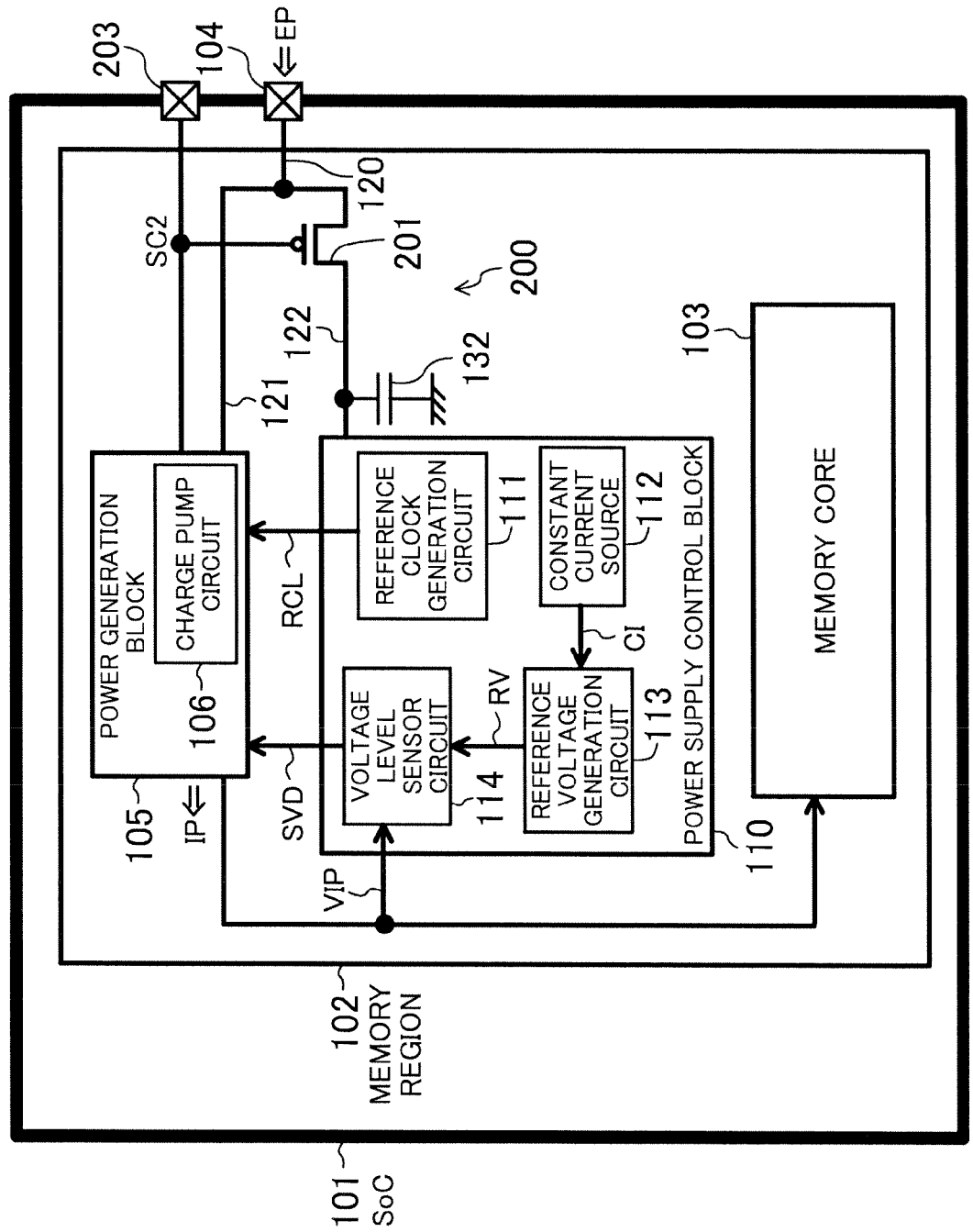
FIG. 3 is a view illustrating a configuration of a semiconductor integrated circuit according to a second embodiment.

FIG. 3 is a view schematically illustrating a configuration of a semiconductor integrated circuit according to a second embodiment. The configuration of FIG. 3 is almost similar to that in FIG. 1, and in FIG. 3, each member also shown in FIG. 1 is identified by the same reference character, and the detailed description thereof is omitted.

The configuration of FIG. 3 is different from that of FIG. 1 in that instead of the resistive element 131, a PMOS transistor 201 is inserted in a second power supply interconnect 122, and the PMOS transistor 201 and a capacitive element 132 are included in a filter section 200. The PMOS transistor 201 receives, at its gate, a switch control signal SC2 applied to an external terminal 203 from outside a SoC 101. Note that the switch control signal SC2 is also applied to a power generation block 105. The configuration of FIG. 3 is different from that of FIG. 1 also in that the switching element 140 is omitted.

When the switch control signal SC2 is a low (L) logic signal, the PMOS transistor 201 conducts (is set to an on state), whereas when the switch control signal SC2 is a high (H) logic signal, the PMOS transistor 201 is set to a non-conductive state (off state). When the switch control signal SC2 is the L logic signal, the power generation block 105 executes pumping operation, whereas when the switch signal SC2 is the H logic signal, that is, shows a value to set the PMOS transistor 201 to the off state, the power generation block 105 stops operating.

Operation of the semiconductor integrated circuit of FIG. 3 will be described. Here, description of points similar to those of the first embodiment is accordingly simplified. First, a case will be described where the power generation block 105 generates internal power IP so that a memory core 103 operates.

External power EP supplied to an external power supply terminal 104 is supplied to the power generation block 105 and a power supply control block 110 via an external power supply interconnect 120 as well as first and second power supply interconnects 121, 122. Here, the PMOS transistor 201 is in a conductive state based on an L logic signal applied as the switch control signal SC2 to the PMOS transistor 201. Since the switch control signal SC is at an L logic level, the power generation block 105 executes the pumping operation. The operation of the power generation block 105 and the power supply control block 110 is the same as that in the semiconductor integrated circuit of FIG. 1, and thus description thereof is omitted.

Here, as described in the first embodiment, during the pumping operation of the power generation block 105, power supply noise caused by the pumping operation may be propagated to the power supply control block 110 via the first and second power supply interconnects 121, 122. When the power supply noise caused by the pumping operation is propagated to the power supply control block 110, a reference voltage RV and a reference clock signal RCL which are generated in the power supply control block 110 are caused to be unstable. This may cause difficulties in stably supplying the internal power IP.

Thus, in the present embodiment, the second power supply interconnect 122 is provided with the filter section 200 including the PMOS transistor 201 and the capacitive element 132. The filter section 200 significantly reduces the propagated power supply noise. That is, the PMOS transistor 201 set to the on state serves as a resistive element having an on-resistance depending on the device size. Thus, it is possible to significantly reduce the influence of the power supply noise caused by the pumping operation of the power generation block 105 over the power supply control block 110. Thus, the power supply control block 110 can generate and supply the reference voltage RV and the reference clock signal RCL which are stable. As a result, it becomes possible to stably supply the internal power IP.

Next, a case will be described where it is not necessary to supply the internal power IP to the memory core 103, for example, where the memory in the SoC 101 is not used.

In this case, an H logic signal is applied as the switch control signal SC2 to the PMOS transistor 201, so that the PMOS transistor 201 is set to the off state. This interrupts supply of the external power EP to the power supply control block 110, so that the power supply control block 110 stops circuit operation. Simultaneously, the H logic signal as the switch control signal SC2 is also applied to the power generation block 105, so that the power generation block 105 stops the pumping operation.

The supply of the external power EP to the power supply control block 110 is interrupted by setting the PMOS transistor 201 provided on the second power supply interconnect 122 to the off state. Thus, current consumption, including stand-by components such as leakage, in the power supply control block 110 is reduced to zero. Moreover, the power generation block 105 stops the pumping operation. As a result, a current consumed by the external power EP in a memory region 102 is only a leakage component in the PMOS transistor 201 and a leakage current in the power generation block 105. As described above, for example, in the case where the memory is not used, the PMOS transistor 201 is set to the off state, and the power generation block 105 stops operating, so that it becomes possible to reduce the current consumption by the external power EP to almost zero.

As described above, according to the present embodiment, it is possible, during the operation of the memory, to significantly reduce the influence of the power supply noise of the external power EP generated in the power generation block 105 over the power supply control block 110. Thus, it becomes possible to stably supply the internal power IP. Moreover, when the memory is not used, the PMOS transistor 201 is set to the off state, and the pumping operation of the power generation block 105 is stopped, so that the current consumption by the external power EP in the memory region 102 can be reduced to almost zero, which allows overall power consumption of the SoC 101 to be significantly reduced.

Moreover, the PMOS transistor 201 is used both as a resistive element for reducing the power supply noise and as a switch for interrupting the external power supply EP. With this configuration, the advantages of reducing the power supply noise and reducing current consumption can be obtained without increasing the memory area.

Note that the device size of the PMOS transistor 201 may accordingly be set in consideration of operational stability of the power supply control block 110, a frequency component of the power supply noise which is to be reduced, etc. As an example, the device size of the PMOS transistor 201 may be such that the on-resistance is 50Ω, and the capacitance value of the capacitive element 132 may be 100 pF. In this case, when the current consumption in the power supply control block 110 is, for example, 500 µA, the voltage drop of the external power EP supplied to the power supply control block 110 can be limited to about 25 mV while high-frequency power supply noise having a cycle of 5 ns or less is removed.

Although, in the present embodiment, the filter section 200 includes the PMOS transistor 201 and the capacitive element 132, the present disclosure is not limited to this. Alternatively, the advantage of reducing the power supply noise can be obtained to some extent by using only the PMOS transistor 201. In this case, the area required for disposition of the capacitive element 132 can be omitted.

Although in the present embodiment, a transistor element used for the filter section 200 is a PMOS transistor, the present disclosure is not limited to this. Alternatively, similar advantages can also be obtained by using an element such as an NMOS-type element, or an element including an NMOS and a PMOS in combination.

Figure 4:
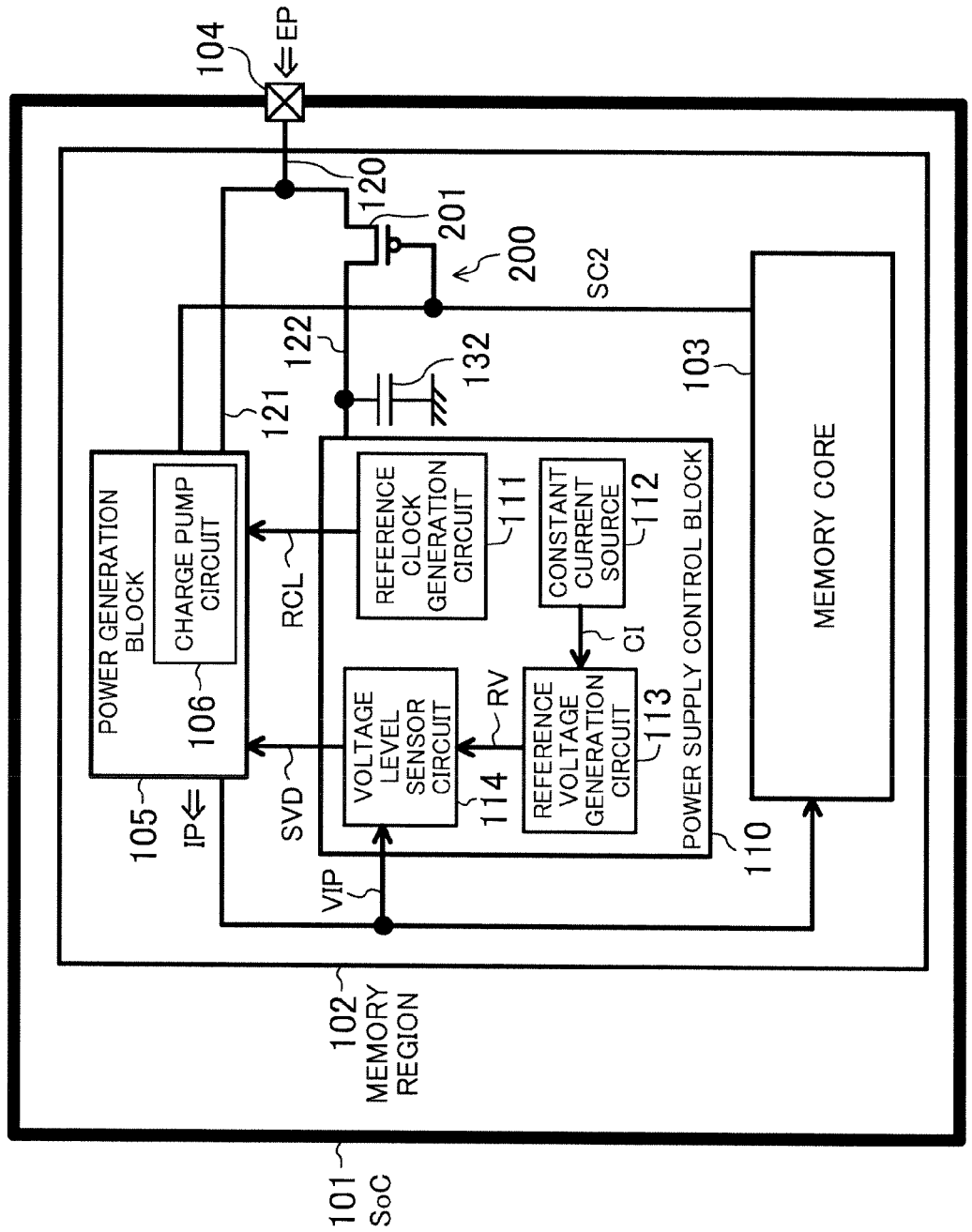
FIG. 4 is a view illustrating a configuration of a semiconductor integrated circuit according to a variation of the second embodiment.

FIG. 4 is a view schematically illustrating a configuration of a semiconductor integrated circuit according to a first variation of the present embodiment. The configuration of FIG. 4 is almost similar to that in FIG. 3, and in FIG. 4, each member also shown in FIG. 3 is identified by the same reference character, and the detailed description thereof is omitted.

The configuration of FIG. 4 is different from that of FIG. 3 in that the switch control signal SC2 is applied not from outside the SoC 101 but from the memory core 103. For example, based on a memory control signal such as a row address strobe (RAS) signal applied from outside the memory region 102, the memory core 103 generates the switch control signal SC2 by a logic circuit. Here, as the switch control signal SC2, the memory core 103 outputs an L logic signal during a period in which a memory operates, and an H logic signal during a period in which the memory stops operating.

Operation of the configuration of FIG. 4 is similar to that of FIG. 3, and thus, similar advantages can be obtained. Additionally, in the present variation, since the switch control signal SC2 is generated inside the SoC 101, which allows the external terminal to be omitted. With this configuration, it is possible to reduce the number of terminals and the chip area.

Although, in the present variation, an example configuration has been described in which the switch control signal SC2 is applied from the memory core 103, the present disclosure is not limited to this. Alternatively, the switch control signal SC2 may be generated by a function block disposed in the SoC 101 other than the memory region 102.

Figure 5:
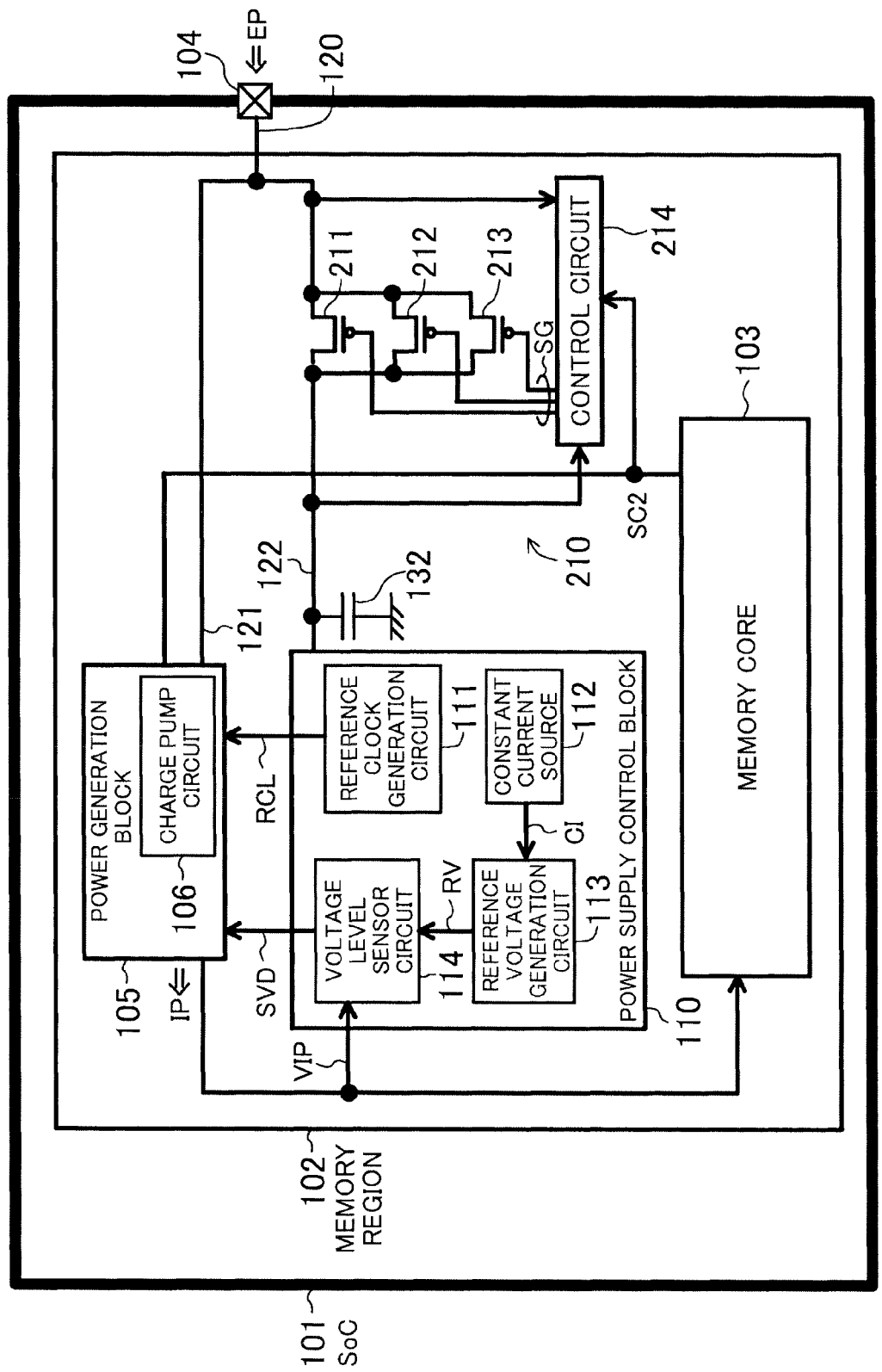
FIG. 5 is a view illustrating a configuration of a semiconductor integrated circuit according to another variation of the second embodiment.

FIG. 5 is a view schematically illustrating a configuration of a semiconductor integrated circuit according to a second variation of the present embodiment. The configuration of FIG. 5 is almost similar to those in FIGS. 3, 4, and in FIG. 5, each member also shown in FIGS. 3, 4 is identified by the same reference character, and the detailed description thereof is omitted.

The configuration of FIG. 5 is different from that of FIG. 4 in that a filter section 210 includes a plurality of PMOS transistors (in the figure, three PMOS transistors) 211, 212, 213 inserted in the second power supply interconnect 122 in parallel, a control circuit 214 configured to apply control signals SG to the gates of the PMOS transistors 211-213, and a capacitive element 132. The control circuit 214 receives a switch control signal SC2, and detects a potential difference between both sides of the PMOS transistors 211-213 of the second power supply interconnect 122, that is, a voltage drop of the external power EP. Based on the degree of the voltage drop, the control circuit 214 controls on/off operation of each of the PMOS transistors 211-213 by the control signal SG. The control circuit 214 includes a voltage level sensor circuit (not shown).

Operation of the semiconductor integrated circuit of FIG. 5, particularly, operation of the control circuit 214 in the filter section 210 will be mainly described. Note that the operation of the power generation block 105 and the power supply control block 110 is similar to that in the semiconductor integrated circuit of FIG. 3.

First, a case will be described in which the power generation block 105 generates internal power IP so that the memory core 103 operates. In this case, the memory core 103 outputs an L logic signal as the switch control signal SC2. The control circuit 214 detects a potential difference between both the sides of the PMOS transistors 211-213 by the voltage level sensor circuit while receiving the L logic switch control signal SC2. The voltage level sensor circuit outputs an internal sensing signal indicating whether or not the degree of the voltage drop of the external power EP in the second power supply interconnect 122 is within a certain range in which no problem is caused. Based on the internal sensing signal, the control circuit 214 sets at least one of the PMOS transistors 211-213 to an on state by the control signal SG.

Moreover, when the voltage drop of the external power EP in the second power supply interconnect 122 increases, the control circuit 214 sets the larger number of the PMOS transistors to the on state, whereas when the voltage drop decreases, the control circuit 214 sets the less number of the PMOS transistors to the on state. That is, when the voltage drop of the external power EP increases to a level which adversely affects stable operation of the power supply control block 110, the number of PMOS transistors brought into conduction is increased to reduce on-resistance of all the transistors, thereby reducing the magnitude of the voltage drop.

When it is not necessary to supply the internal power IP to the memory core 103, the memory core 103 outputs an H logic signal as the switch control signal SC2. The control circuit 214 sets all the PMOS transistors 211-213 to an off state by the control signals SG while receiving the H logic switch control signal SC2. This interrupts supply of the external power EP to the power supply control block 110.

The present variation provides advantages similar to those provided by the configuration of FIG. 3. Additionally, a plurality of transistors are inserted in the second power supply interconnect 122 in parallel, and the on/off operation of each transistor is controlled based on the magnitude of the voltage drop of the external power EP, so that the on-resistance values of the transistors in the filter section 210 are adjustable according to the magnitude of the voltage drop of the external power EP. Thus, the voltage drop of the external power supply EP caused by the filter section 210 can be reduced.

Note that in a manner similar to FIG. 3, the switch control signal SC2 may be applied from outside the SoC 101. Alternatively, the switch control signal SC2 may be applied by other function blocks.

Figure 6:
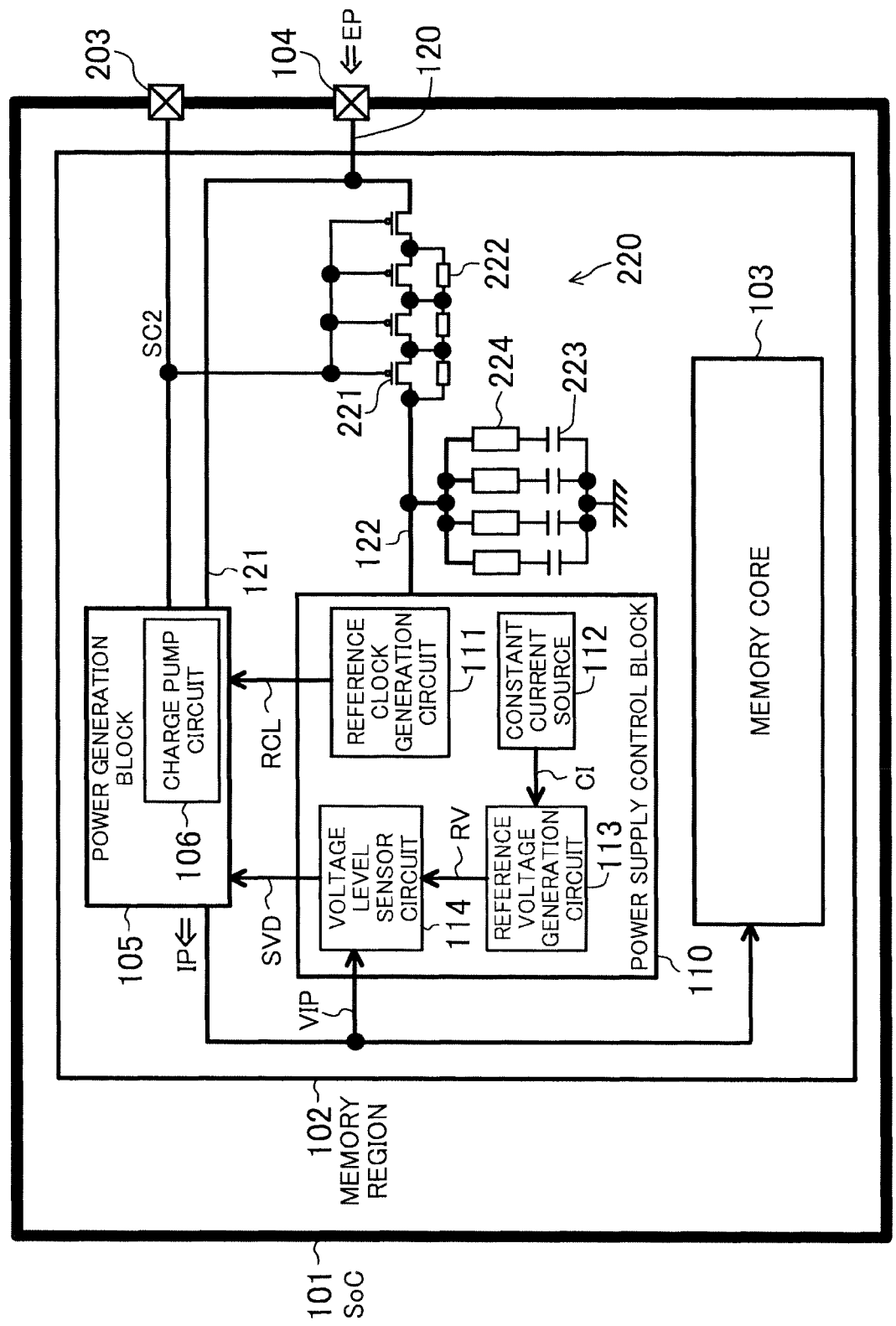
FIG. 6 is a view illustrating a configuration of a semiconductor integrated circuit according to a variation of the second embodiment.

FIG. 6 is a view schematically illustrating a configuration of a semiconductor integrated circuit according to a third variation of the present embodiment. The configuration of FIG. 6 is almost similar to that in FIG. 3, and in FIG. 6, each member also shown in FIG. 3 is identified by the same reference character, and the detailed description thereof is omitted.

The configuration of FIG. 6 is different from that of FIG. 3 in that a filter section 220 includes a plurality of PMOS transistors 221 (in the figure, four PMOS transistors) which are connected to each other in series, and first fuse elements 222 connected to three of the MOS transistors 221 in parallel, and in that a plurality of capacitive elements 223 (in the figure, four capacitive elements) are connected to each other in parallel, and a second fuse element 224 is connected to each of the capacitive elements 223 in series. Each of the fuse elements 222, 224 can be blown individually.

As described above, in the filter section 220, the fuse elements 222, 224 are provided, so that it is possible to adjust the on-resistance of all the PMOS transistors 221 and the capacitance values of all the capacitive elements 223. Thus, for example, both in a wafer state and in a packaged state, the fuse elements 222, 224 are blown according to results of evaluation of actual operation of the memory, and the like, so that noise suppression characteristics of the filter section 220 can be adjusted.

The configuration of the filter section 220 illustrated in the present variation is a mere example. Positions in which the fuse elements 222, 224 are arranged, the number of the fuse elements 222, 224, the number of the PMOS transistors 221 and the capacitive elements 223, etc. are not limited to this configuration. Similar advantages can be obtained by other configurations in which the number of transistors and the capacitive elements can be adjusted by blowing the fuses, for example, by a configuration in which connection of the transistors and the capacitive elements is controlled by a switching element configured to receive a logic signal based on a fuse blowing signal.

Note that in a manner similar to FIG. 4, the switch control signal SC2 may be applied from outside the memory core 103. Alternatively, the switch control signal SC2 may be applied by other function blocks.

Third Embodiment

Figure 7:
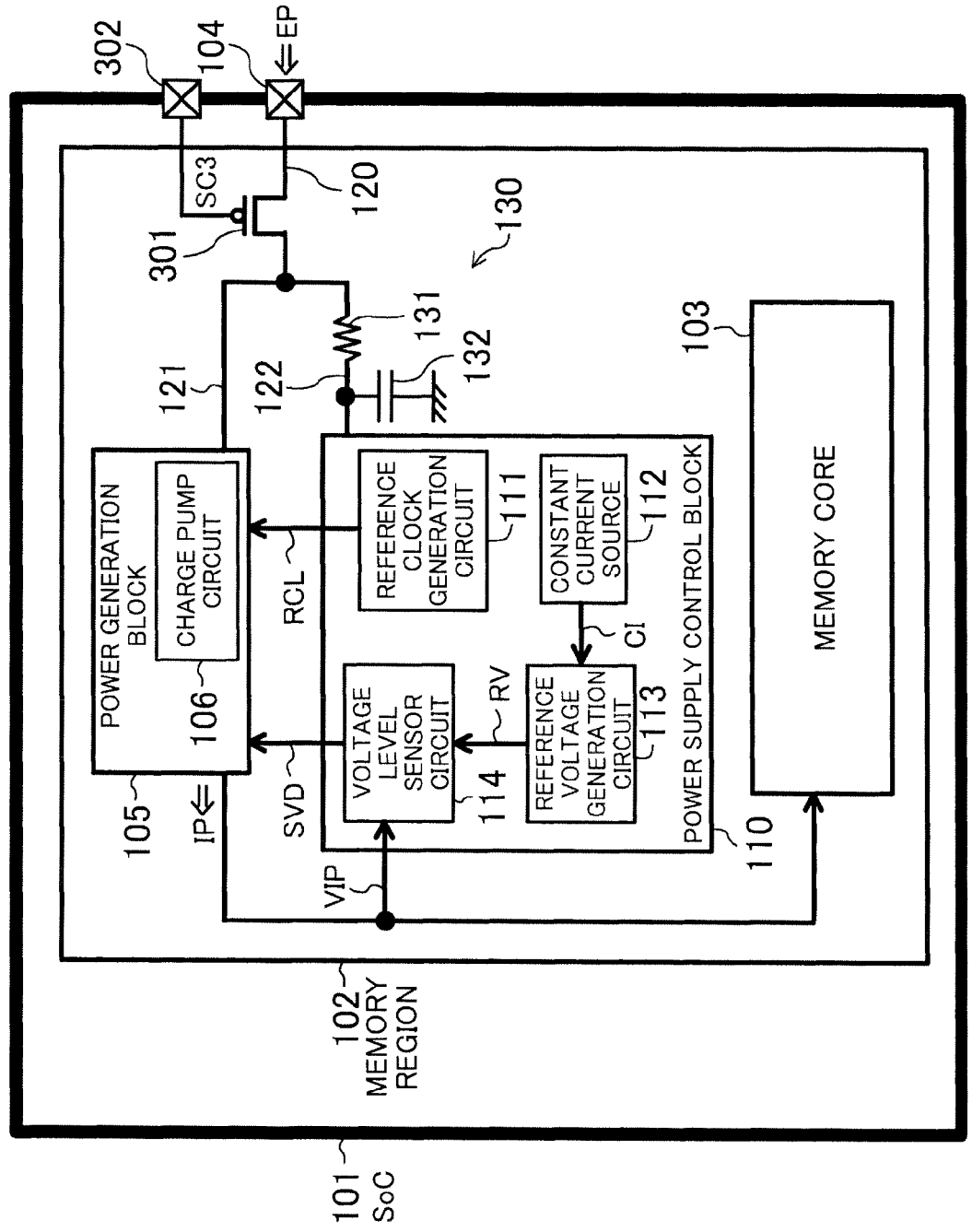
FIG. 7 is a view illustrating a configuration of a semiconductor integrated circuit according to a third embodiment.

FIG. 7 is a view schematically illustrating a configuration of a semiconductor integrated circuit according to a third embodiment. The configuration of FIG. 7 is almost similar to that in FIG. 1, and in FIG. 7, each member also shown in FIG. 1 is identified by the same reference character, and the detailed description thereof is omitted.

The configuration of FIG. 7 is different from that of FIG. 1 in that a PMOS transistor 301 is provided instead of the switching element 140 provided on the external power supply interconnect 120. The PMOS transistor 301 receives, at its gate, a switch control signal SC3 applied to an external terminal 302 from outside a SoC 101. When the switch control signal SC3 is an L logic signal, the PMOS transistor 301 conducts (is set to an on state), whereas when the switch control signal SC3 is an H logic signal, the PMOS transistor 201 is set to a non-conductive state (off state).

When a power generation block 105 generates internal power IP so that a memory core 103 operates, the PMOS transistor 301 is in the conductive state based on an L logic signal applied as the switch control signal SC3 to the PMOS transistor 301. On the other hand, when the SoC 101 does not use a memory, an H logic signal is applied as the switch control signal SC3 to the PMOS transistor 301, so that the PMOS transistor 301 is set to the off state. Operation of the power generation block 105 and a power supply control block 110 is similar to that in the semiconductor integrated circuit of FIG. 1, and description thereof is omitted.

According to the present embodiment, it is possible, during the operation of the memory, to significantly reduce the influence of power supply noise of external power EP generated in the power generation block 105 over a power supply control block 110. Thus, it becomes possible to stably supply the internal power IP. Moreover, when the memory is not used, the PMOS transistor 301 is set to the off state, so that the current consumption by the external power EP in a memory region 102 can be reduced to almost zero, which allows overall power consumption of the SoC 101 to be significantly reduced.

Moreover, during the operation of the memory, on-resistance of the PMOS transistor 301 set to the on state serves to reduce propagation of the power supply noise of the external power EP generated in the power generation block 105 to an external power supply terminal 104. That is, the PMOS transistor 301 is used both as a resistive element to reduce the power supply noise and as a switch to interrupt the external power EP.

Figure 8:
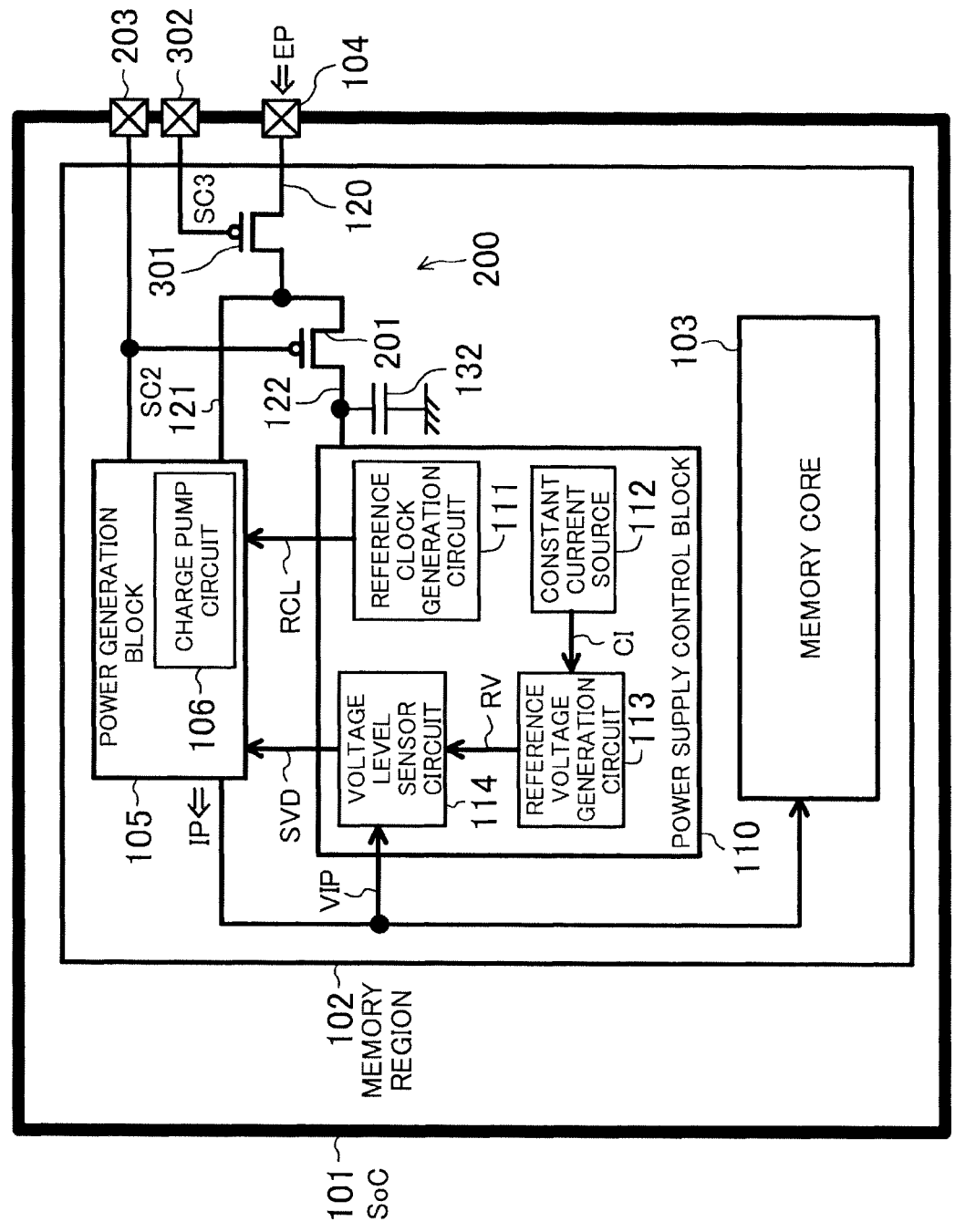
FIG. 8 is a view illustrating a configuration of a semiconductor integrated circuit according to a variation of the third embodiment.
Figure 9:
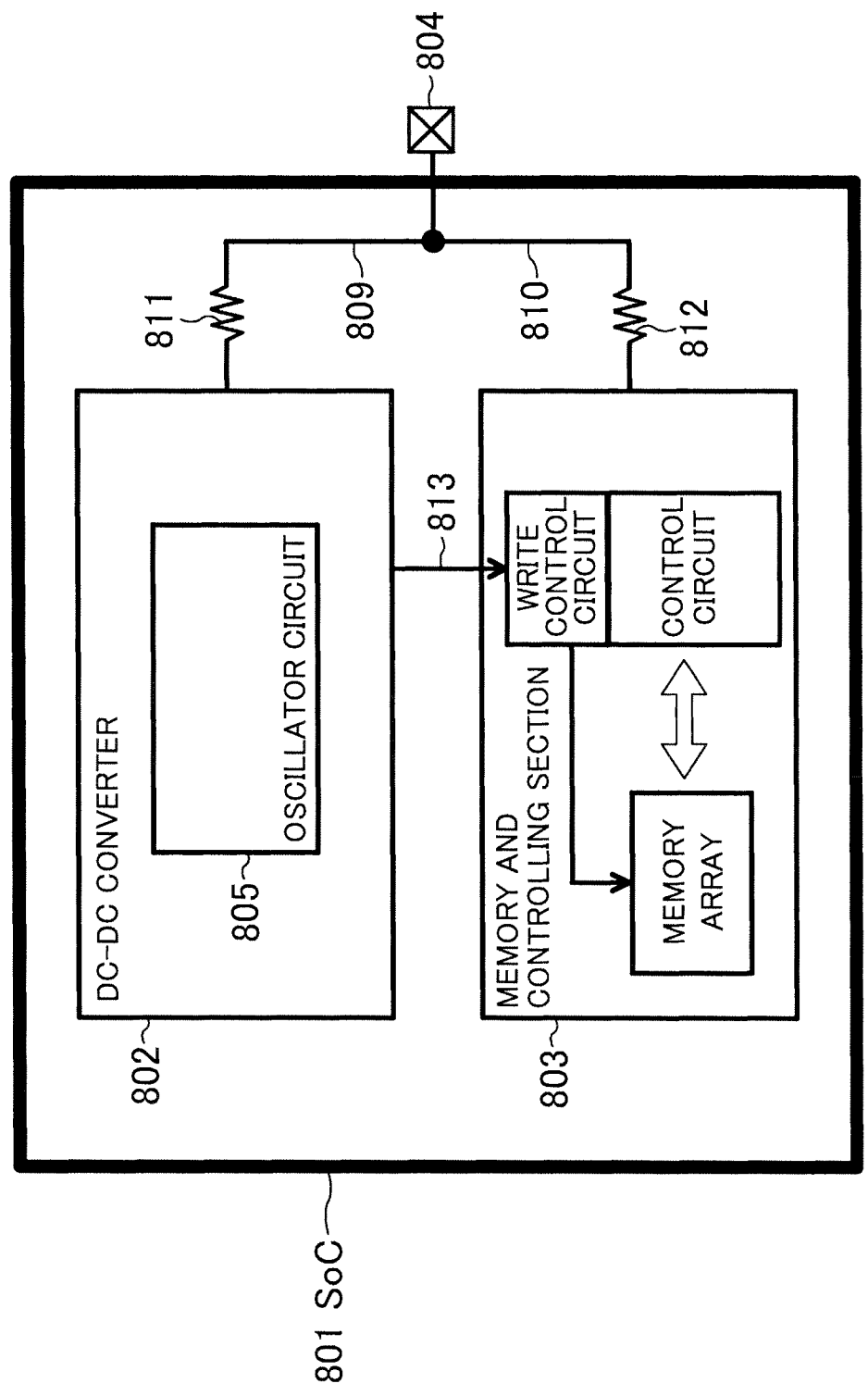
FIG. 9 is a view illustrating a configuration of a conventional semiconductor integrated circuit.

FIG. 8 is a view schematically illustrating a configuration of a semiconductor integrated circuit according to a variation of the present embodiment. This configuration is obtained by adding the PMOS transistor 301 and the external terminal 302 of FIG. 7 to the configuration of FIG. 3. The configuration of FIG. 8 also provides advantages similar to those of FIG. 3 and FIG. 7. In FIG. 8, the PMOS transistor 301 may be replaced with the switching element 140 of FIG. 1.

Although in the present embodiment, a transistor element provided on the external power supply interconnect 120 is a PMOS transistor, the present disclosure is not limited to this.

Alternatively, similar advantages can also be obtained by using an element such as an NMOS-type element, or an element including an NMOS and a PMOS in combination.

In the embodiments described above, the reference clock signal RCL used by the power generation block 105 is applied from the power supply control block 110. However, instead of this configuration, for example, the power generation block 105 may receive a system clock of the SoC 101 or a clock generated from the system clock.

Although in the embodiments described above, a filter section is provided on the second power supply interconnect 122, the present disclosure is not limited to this. Alternatively, the filter section may be provided on the first power supply interconnect 121, or filter sections may be provided on the first and second power supply interconnects 121, 122. Note that when the filter section is provided on the first power supply interconnect 121, the device size, and the like have to be determined, considering that the current consumption of the power generation block 105 is greater than that of the power supply control block 110 due to pumping operation, with attention to the voltage drop of the external power supply EP in the filter section.

Although in the embodiments described above, the filter sections 130, 200, 210, 220, the switching element 140, the PMOS transistor 301, and the like are provided in the memory region 102, the present disclosure is not limited to this. All or some of these elements may be provided in regions other than the memory region 102, for example, in a logic region or an IO region.

Although in the embodiments described above, a boosted power supply block which generates internal power IP whose power supply voltage is higher than that of external power EP is used as the power generation block 105, the present disclosure is not limited to this. Similar advantages can be obtained also in the case where an internal negative voltage power supply block configured to generate a negative voltage is used.

Although in the embodiments described above, the voltage level sensing signal SVD is output when the power supply voltage VIP of the internal power IP is lower than the reference voltage RV, the method for controlling the voltage of the internal power IP is not limited to this. Alternatively, the voltage level sensing signal SVD may be output when the power supply voltage VIP of the internal power IP is higher than the reference voltage RV. Alternatively, upper and lower limits of the reference voltage are set, and the voltage level sensing signal SVD may be output when the power supply voltage VIP of the internal power IP is out of the range from the upper reference voltage to the lower reference voltage. In this case, it is also possible to limit an excessive increase in power supply voltage VIP of the internal power IP.

Although in the embodiments described above, the internal power IP is supplied to the memory core 103, the present disclosure is not limited to this. Each of the embodiments described above is applicable to a configuration in which internal power having a power supply voltage different from that of an external power is supplied to a circuit block other than the memory, for example, to a processor, or the like, and advantages similar to those of each of the embodiments described above can be obtained.

According to the present disclosure, in a semiconductor integrated circuit including an internal power supply circuit using a charge pump circuit, internal power can be stably supplied. Thus, the semiconductor integrated circuit of the present disclosure is useful for, for example, stabilizing operation and reducing costs of a SoC.

What is claimed is:

1. A semiconductor integrated circuit provided on a single semiconductor chip, the semiconductor integrated circuit comprising:
   an external power supply interconnect through which external power supplied from outside the semiconductor chip is transferred;
   a power generation block including a charge pump circuit, and configured to generate internal power by the charge pump circuit based on the external power and output, at an output of the power generation block, the generated internal power, the internal power having a different power supply voltage from the external power;
   a power supply control block configured to control the power generation block;
   a circuit block configured to operate with the internal power;
   a first power supply interconnect branching off from the external power supply interconnect, and connected to an input of the power generation block, the power generation block receiving, at the input of the power generation block, the external power via the first power supply interconnect;
   a second power supply interconnect branching off from the external power supply interconnect, and connected to an input of the power supply control block, the power supply control block receiving, at the input of the power supply control block, the external power via the second power supply interconnect; and
   a filter section provided on the second power supply interconnect and disposed between the external power supply interconnect and the input of the power supply control block, and configured to remove noise propagating through the second power supply interconnect, wherein:
   the filter section includes:
     a resistor inserted in the second power supply interconnect; and
     a capacitor connected between the second power supply interconnect and ground, and
   a first terminal of the capacitor is directly connected to a connection point between the resistor and the power supply control block, and a second terminal of the capacitor is connected to the ground.

2. A semiconductor integrated circuit provided on a single semiconductor chip, the semiconductor integrated circuit comprising:
   an external power supply interconnect through which external power supplied from outside the semiconductor chip is transferred;
   a power generation block including a charge pump circuit, and configured to generate internal power by the charge pump circuit based on the external power and output, at an output of the power generation block, the generated internal power, the internal power having a different power supply voltage from the external power;
   a power supply control block configured to control the power generation block;
   a circuit block configured to operate with the internal power;
   a first power supply interconnect branching off from the external power supply interconnect, and connected to an input of the power generation block, the power generation block receiving, at the input of the power generation block, the external power via the first power supply interconnect;
   a second power supply interconnect branching off from the external power supply interconnect, and connected to an input of the power supply control block, the power supply control block receiving, at the input of the power supply control block, the external power via the second power supply interconnect; and a filter section provided on the second power supply interconnect and disposed between the external power supply interconnect and the input of the power supply control block, and configured to remove noise propagating through the second power supply interconnect, wherein:

the filter section includes:
- a MOS transistor inserted in the second power supply interconnect, and having a gate to which a switch control signal is applied; and
- a capacitor connected between the second power supply interconnect and ground, and
- a first terminal of the capacitor is directly connected to a connection point between the MOS transistor and the power supply control block, and a second terminal of the capacitor is connected to the ground.

3. The semiconductor integrated circuit of claim 2, wherein the switch control signal is applied from outside the semiconductor chip.

4. The semiconductor integrated circuit of claim 2, wherein:
- the switch control signal is also applied to the power generation block, and
- the power generation block is configured to stop operating when the switch control signal shows a value to set the MOS transistor to an off state.

5. The semiconductor integrated circuit of claim 1, further comprising:
- a switching element inserted in the external power supply interconnect, wherein:
- an on/off operation of the switching element is controlled by a switch control signal, and
- a first terminal of the switching element is connected to the external power supply interconnect and a second terminal of the switching element is connected to the first power supply interconnect and the second power supply interconnect.

6. The semiconductor integrated circuit of claim 5, wherein the switching element is a MOS transistor having a gate to which the switch control signal is applied.

7. The semiconductor integrated circuit of claim 1, wherein the resistor and the capacitor overlap each other when viewed from above.

8. The semiconductor integrated circuit of claim 1, wherein at least any one of the resistor and the capacitor overlaps the circuit block or a circuit block other than the circuit block when viewed from above.

9. The semiconductor integrated circuit of claim 1, wherein the power generation block is a boosted power supply block configured to generate the internal power having a higher power supply voltage than the external power.

10. The semiconductor integrated circuit of claim 1, wherein the circuit block includes a memory core.

11. The semiconductor integrated circuit of claim 1, wherein the power supply control block is configured to generate a reference clock signal for controlling a pumping operation of the charge pump circuit, and to supply the generated reference clock signal to the power generation block.

12. The semiconductor integrated circuit of claim 1, wherein the power supply control block is configured to generate a reference voltage with which the power supply voltage of the internal power is compared.

13. The semiconductor integrated circuit of claim 2, further comprising:
- a switching element inserted in the external power supply interconnect, wherein:
- an on/off operation of the switching element is controlled by a second switch control signal, and
- a first terminal of the switching element is connected to the external power supply interconnect and a second terminal of the switching element is connected to the first power supply interconnect and the second power supply interconnect.

14. The semiconductor integrated circuit of claim 13, wherein the switching element is a MOS transistor having a gate to which the second switch control signal is applied.

15. The semiconductor integrated circuit of claim 2, wherein the power generation block is a boosted power supply block configured to generate the internal power having a higher power supply voltage than the external power.

16. The semiconductor integrated circuit of claim 2, wherein the circuit block includes a memory core.

17. The semiconductor integrated circuit of claim 2, wherein the power supply control block is configured to generate a reference clock signal for controlling pumping operation of the charge pump circuit, and to supply the generated reference clock signal to the power generation block.

18. The semiconductor integrated circuit of claim 2, wherein the power supply control block is configured to generate a reference voltage with which the power supply voltage of the internal power is compared.

19. A semiconductor integrated circuit provided on a single semiconductor chip, the semiconductor integrated circuit comprising:
- an external power supply interconnect through which external power supplied from outside the semiconductor chip is transferred;
- a power generation block including a charge pump circuit, and configured to generate internal power by the charge pump circuit based on the external power, the internal power having a different power supply voltage from the external power;
- a power supply control block configured to control the power generation block;
- a circuit block configured to operate with the internal power;
- a first power supply interconnect branching off from the external power supply interconnect, and connected to the power generation block;
- a second power supply interconnect branching off from the external power supply interconnect, and connected to the power supply control block; and
- a filter section provided on the second power supply interconnect, and configured to remove noise propagating through the second power supply interconnect, wherein:

the filter section includes:
- a MOS transistor inserted in the second power supply interconnect, and having a gate to which a switch control signal is applied; and
- a capacitor connected between the second power supply interconnect and ground, and the switch control signal is applied from outside the semiconductor chip.

* * * * *